(12) United States Patent
Bracmard et al.

(10) Patent No.: US 7,907,002 B2
(45) Date of Patent: Mar. 15, 2011

(54) OUTPUT LEVEL VOLTAGE REGULATION

(75) Inventors: Gaetan Bracmard, Fuveau (FR); Henri Bottaro, Aix-en-Provence (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/221,008

(22) Filed: Sep. 7, 2005

(65) Prior Publication Data

US 2006/0273847 A1     Dec. 7, 2006

(30) Foreign Application Priority Data

Jun. 6, 2005   (FR) ...................................... 05 05712

(51) Int. Cl.
*G05F 1/10* (2006.01)

(52) U.S. Cl. ........... 327/540; 327/543; 327/77; 323/313

(58) Field of Classification Search .................. 327/540, 327/541, 543
See application file for complete search history.

(56) References Cited

U.S. PATENT DOCUMENTS

| | | | | |
|---|---|---|---|---|
| 4,638,188 A * | 1/1987 | Cray | ................................ | 326/99 |
| 5,675,231 A * | 10/1997 | Becerra et al. | ................ | 318/801 |
| 5,815,355 A | 9/1998 | Dawes | ............................ | 361/56 |
| 5,859,757 A | 1/1999 | Hanafusa et al. | ............. | 361/100 |
| 5,945,920 A | 8/1999 | Maletsky | .................. | 340/825.54 |
| 6,028,755 A | 2/2000 | Saeki et al. | .................. | 361/91.1 |
| 6,052,770 A | 4/2000 | Fant | | |
| 6,157,206 A * | 12/2000 | Taylor et al. | ..................... | 326/30 |
| 6,229,443 B1 | 5/2001 | Roesner | ..................... | 340/572.1 |
| 6,452,766 B1 | 9/2002 | Carper | ............................. | 361/18 |
| 6,512,411 B2 * | 1/2003 | Meng et al. | .................... | 327/536 |
| 6,515,919 B1 | 2/2003 | Lee | ................................. | 365/192 |
| 6,667,605 B2 * | 12/2003 | Balakrishnan et al. | ........ | 323/277 |
| 6,813,209 B2 | 11/2004 | Crain et al. | .................... | 365/208 |
| 6,815,979 B2 * | 11/2004 | Ooshita | ........................... | 326/30 |
| 6,861,895 B1 | 3/2005 | Liu et al. | | |
| 7,023,672 B2 * | 4/2006 | Goodfellow et al. | ........... | 361/18 |

FOREIGN PATENT DOCUMENTS

WO     WO-06132821 A2     12/2006

OTHER PUBLICATIONS

Document printout: "Single-Ended Open-Loop Level Shifter Circuit", IP.com database, publ. Nov. 10, 2004, 2 pages.

H. Schutte, "Bi-directional Level Shifter for I²C-bus and other Systems", Philips Semiconductors, Appln. Note AN97055, Aug. 4, 1997, 16 pages.

* cited by examiner

*Primary Examiner* — Lincoln Donovan
*Assistant Examiner* — Ryan C Jager
(74) *Attorney, Agent, or Firm* — Schwegman, Lundberg & Woessner, P.A.

(57) ABSTRACT

A circuit adapting pin output levels to a reference level in which a digital comparator compares an output voltage from an output pin of a device to a reference voltage level. The comparator, relying on the polarity of the comparator output as well as the registered polarity of the comparator output on the previous clock cycle, signals a state machine, which sends a clocked signal to a sense circuit and voltage regulator. The sense circuit may modify a resistance in a switched resistor network, such that the output level is incrementally stepped at clocked intervals towards the reference voltage until the polarity of the error signal reverses. When the output voltage crosses the reference voltage threshold, the comparator flips states and continues to regulate output pin voltage to the reference voltage level.

22 Claims, 3 Drawing Sheets

Fig._3

OUTPUT LEVEL VOLTAGE REGULATION

TECHNICAL FIELD

The invention relates to electrical interface circuits and, more particularly, to a circuit for matching an output voltage to a desired voltage.

BACKGROUND

Computer systems are comprised of a number of electronic components that must interoperate. To minimize the costs of various components, different components are made which operate at different voltages. If the output level is not compatible with an input level, the device may be damaged and interoperation thwarted.

In prior circuit design, a level shifter circuit commonly would be used to interconnect devices, for example by interconnecting sections of a bus system. Each section would have a different supply voltage and different logic level. In a typical example, each section would have a supply voltage; pull up resistors and devices connected to the supply voltage; and a serial data bus line and a serial clock bus line connected to the devices. An exemplary level shifter circuit would include a gate connected to the lower voltage supply, sources connected to the lower voltage bus lines, and drains connected to the higher voltage bus lines. One such level shifter circuit would be required for each different supply voltage.

Level shifter circuits are generally specific to specific voltage levels. Thus for each device or group of devices having a specific voltage operating level, the system requires specific circuitry to allow use of the devices.

SUMMARY

A circuit and method of adapting an output voltage level toward a target voltage level includes applying an output voltage from a pin or pad to an output line and applying a reference voltage to a reference voltage line for comparison by a comparator having a logical output, high or low. A state machine receives a signal from the comparator. The state machine generates a trim bus signal in response to the signal from the comparator and in response to the registered prior logic output. If the two polarities match, further corrective voltage feedback is required. If the two polarities do not match, corrective voltage feedback of the opposite sign is indicated by flipping the output state of the comparator. A clocked trim bus signal is sent to a sense circuit and voltage regulator, which changes a switched resistor value to step the output voltage one step towards the reference voltage. Thus if the output voltage was below the reference voltage, the resistor value (resistance) of the sense circuit and voltage regulator is changed to increase the output voltage one step towards the reference voltage. The comparison between the output voltage and the reference voltage would then be repeated on the next clock cycle, as will the subsequent steps effected by the comparator, the state machine, and the sense/resistor. Sequential voltage steps would be completed until the output voltage crossed the reference voltage threshold in polarity. At this point the comparator signal would flip states, signaling the state machine to save the trim bus value into a register.

DETAILED DESCRIPTION

Figure 1:
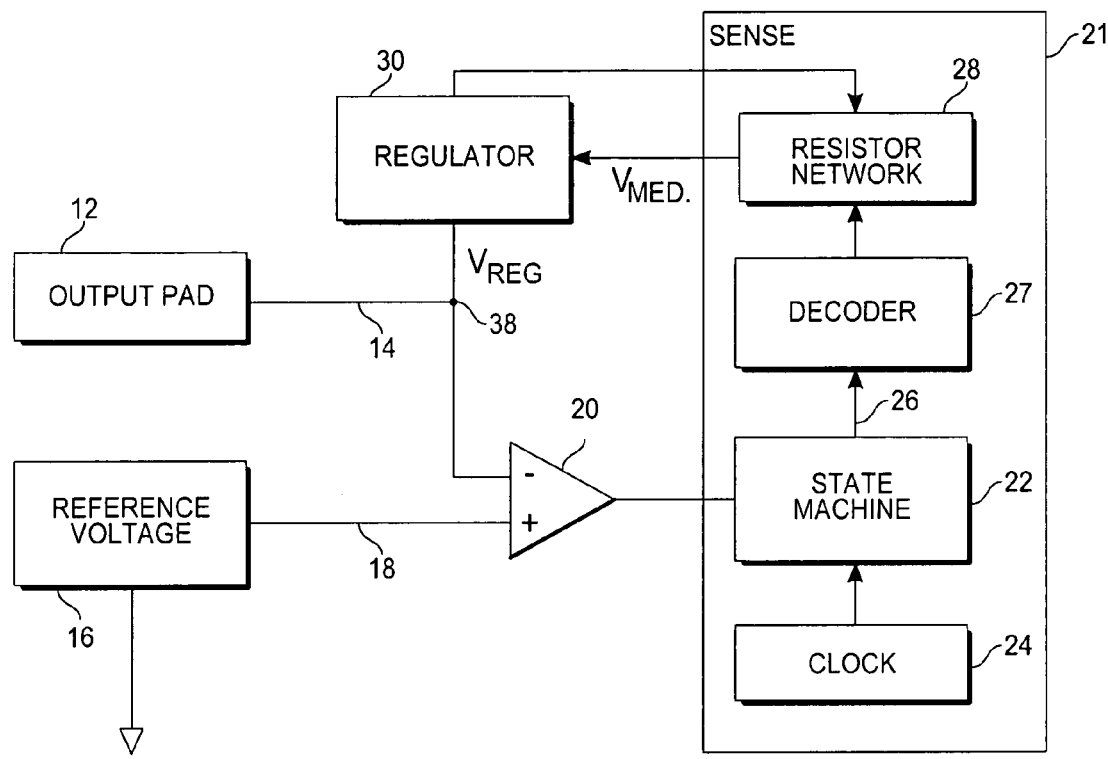
FIG. 1 is a circuit overview of an output adapter.

With reference to FIG. 1, an output pad 12 produces an output voltage applied at output line 14. A reference supply, such as a tester 16, produces a stable and fixed reference voltage onto line 18. These are compared by comparator 20, an analog error amplifier that produces an output by sensing an error either above or below the reference threshold voltage. The resulting comparator output will be either a logic high or low, depending upon the polarity of the error.

Figure 2:
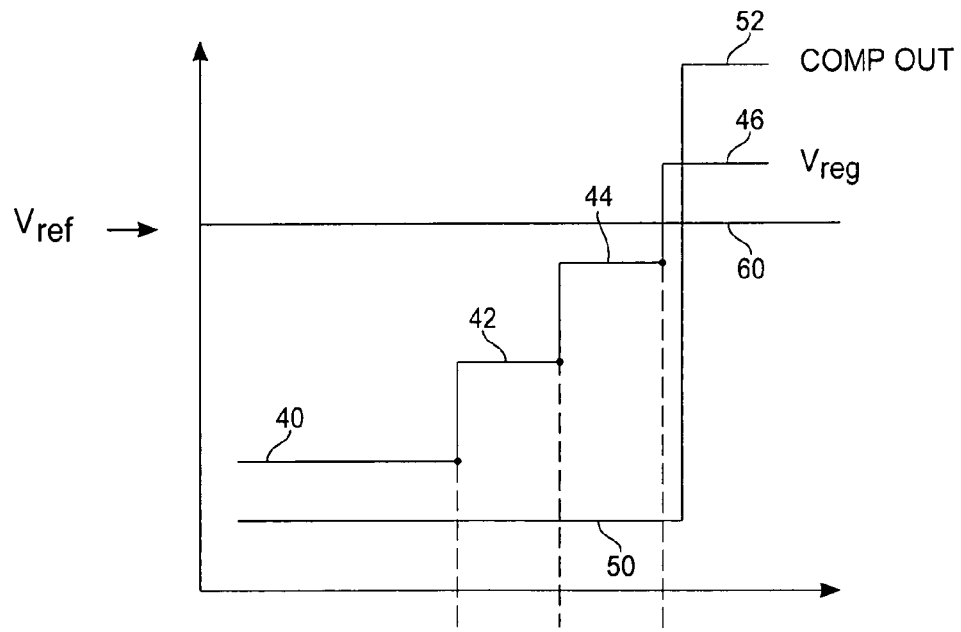
FIG. 2 is a graph of signal voltage over time using a circuit such as the circuit of FIG. 1.

Referring to FIG. 2, the initial output voltage level 40 is compared to the reference voltage level 60. Since initially the value of the voltage 40 at node 38 in FIG. 1 is below the reference voltage level, in this example the state of the comparator output remains at low state 50.

Returning to FIG. 1, the comparator 20 sends a signal to the state machine 22, a logic device. The logic device has registered what it did on the previous cycle. If the error signal was of the same polarity on the previous clock cycle then the incremental output signal is set to be one step larger than the prior output signal. If the error signal has a reverse polarity, then the incremental output signal is one step of opposite polarity. The state machine 22 receives a clock signal from the clock 24, allowing clocking of logic signals and register of the state machine. The state machine sends a three-bit trim bus value signal to decoder 27 for establishing a correction voltage in a resistor network 28. The signal is sent on three-bit line 26, such that a three-bit word may be transmitted. A three-bit word may encode eight states of the trim bus value, or four bits and a sign bit, presenting a number of corresponding voltage step heights that are possible. The sense circuit 21 and voltage regulator 30 are part of a voltage feedback loop that may be changed to alter output voltage at node 38. This is done in defined increments corresponding to the eight step heights described above. The output signal is stepped up or down a maximum of one step per clock cycle until the polarity of the error signal in the comparator reverses.

Again with reference to FIG. 2, output signal 42 is shown stepped up one step per clock cycle compared to output level 40. At this voltage output level, the output voltage 42 is still below the reference voltage 60. Thus, as explained in FIG. 1, the comparator output logic level remains at low state 50. The state machine, a clocked logic device, adds one to the registered state of the trim bus value in a signal which is again transmitted to the sense circuit and voltage regulator. The regulator again incrementally changes the resistance of the feedback loop, again increasing the output voltage in a stepped manner so long as the error signal maintains its polarity.

In FIG. 2, the result of this is the output voltage level 44 is maintained at a one step increase for one clock cycle with clock intervals indicated by vertical dashed lines. This process is repeated. An increase, to output voltage 46, is compared in the comparator to reference voltage 60. At this point the output voltage is above the reference voltage 60 and the polarity of the error signal is reversed. The comparator output then flips states to high state 52. This signals the state machine to memorize the trim bus value into a memory.

In the example of FIG. 2, the output voltage is initially below the reference voltage. This voltage is incrementally stepped up at clocked intervals until the output voltages crosses the reference voltage threshold. The incremental stepping of the output voltage in the direction of the reference voltage is effected by modifying a switched resistor network described below with reference to FIGS. 3 and 4. This is repeated in clocked cycles until the output voltage crosses the reference voltage threshold. It is also possible that the initial output voltage be above the reference voltage. In this case, the comparator logic level would start in the high state, indicating to the state machine that the output voltage level is above the reference voltage threshold. The trim bus logic signal value would then signal the switched resistor network to modify resistance for the output, incrementally stepping down the voltage. This would be repeated until the output voltage crossed the reference voltage threshold in polarity. At that time the comparator would flip state, in this instance from high to low. The trim bus logic signal value would again be saved into a register for comparison with polarity of the next logic signal value. If the polarity is the same, the previous logic signal value is increased by one unit. If the polarity is the opposite, the previous logic signal value is decremented by one unit.

Figure 3:
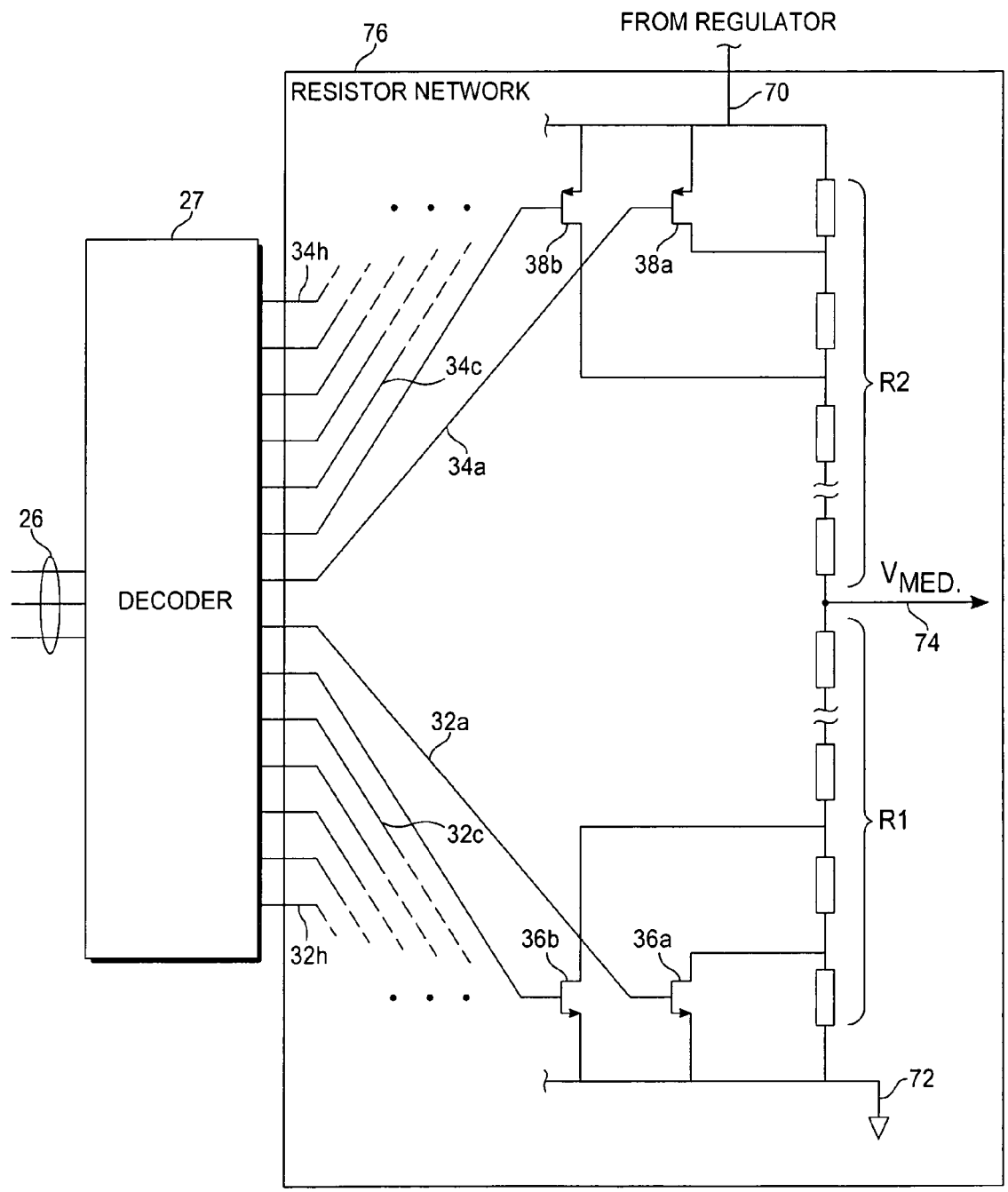
FIG. 3 is a circuit diagram of the resistor network shown as a block in FIG. 1.
Figure 4:
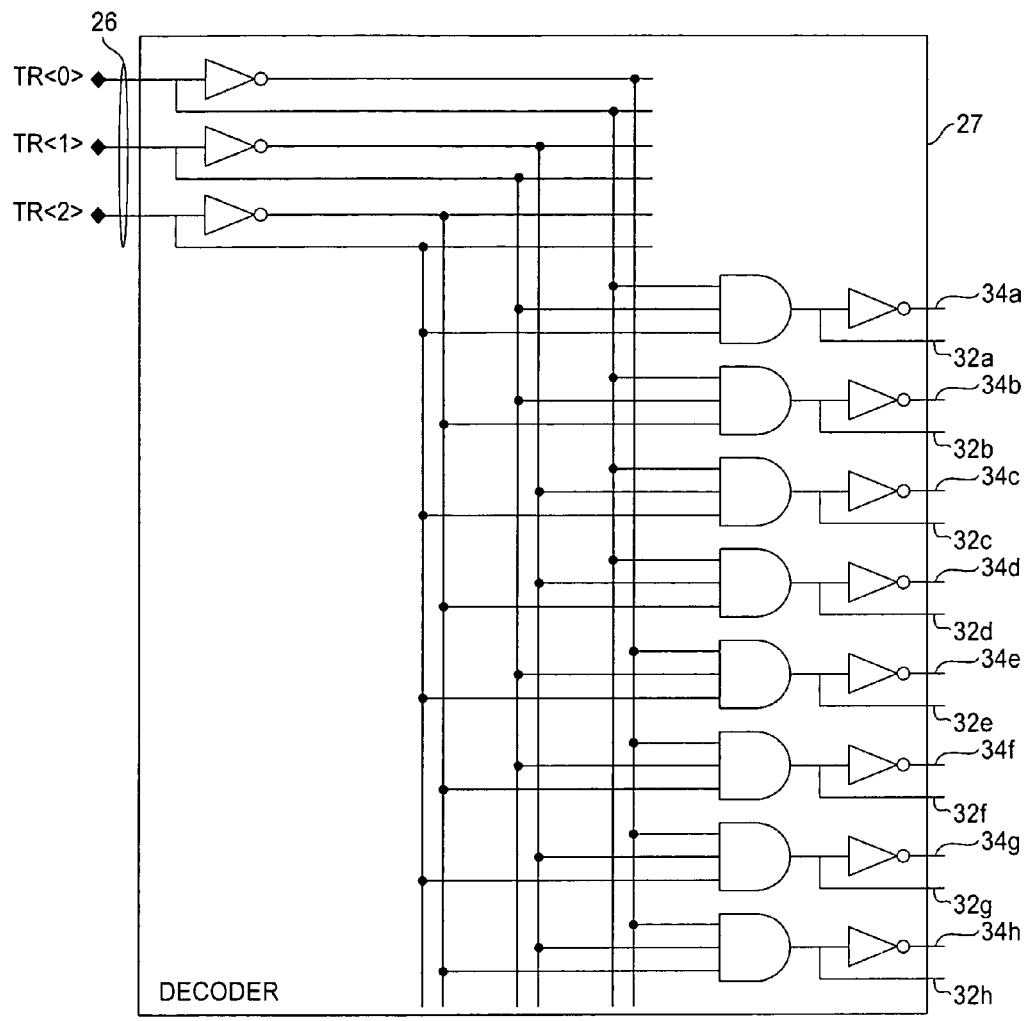
FIG. 4 is a circuit diagram of the decoder circuit shown as a block in FIGS. 1 and 3.

With reference to FIG. 3, decoder 27 is seen to receive three-trim bits on line 26. The three-trim bits, also shown in FIG. 4, generate eight unique signal in decoder block 27. In FIG. 4 there is a logic arrangement wherein three parallel bits are translated to eight possible signals. The eight possible logic signals, appearing one at a time, are taken as logic output signals 32a-32h and their corresponding complements 34a-34h. The complementary output signals, e.g., 32c and 34c, are delivered as simultaneous logical outputs. Returning to FIG. 3, the simultaneous logical outputs are split to drive corresponding CMOS driver transistors pairs of opposite conductivity types in resistor network 76. For example, p-channel CMOS transistor 38a has a control gate operated by logic signal 34a, while the corresponding n-channel CMOS transistor 36a has a control gate operated by logic signal 32a. Each p-channel transistor 38a, 38b, etc. delivers regulated bias voltage on line 70 to a lower level in the series of resistors R2. Transistor 38a bypasses one resistor with bias voltage. Transistor 38b bypasses two resistors, and so on. On the other hand, each n-channel transistor 36a, 36b, etc. shorts resistors to ground 72 in the series of resistors R1. The n-channel transistor 36a shorts one resistor to ground. Transistor 36b shorts two resistors, and so on. It is seen that the p-channel and n-channel transistors behave in a complementary manner to deliver an intermediate output voltage, $V_{MED}$, on output line 74 that may be half way, or some calculated value based upon selected resistor values, between the regulated supply voltage and ground. Resistor values in resistor network 76 are selected to give $V_{MED}$ the proper voltage for a given regulated supply voltage applied across selected resistors in R1 and R2 groups.

Figure 5:
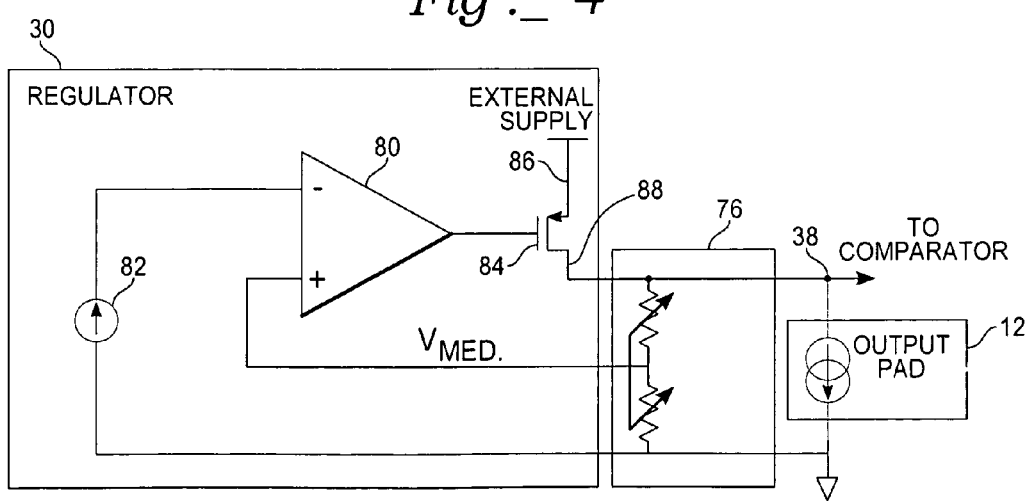
FIG. 5 is a circuit diagram of the regulator shown as a block in FIG. 1.

Resistor network 76 is seen in FIG. 5 to deliver the voltage output, $V_{MED}$ to an operational amplifier 80 in regulator 30 which was discussed with reference to FIG. 1. The voltage level $V_{MED}$ is combined with a bandgap reference level from device 82 to adjust a supply transistor 84 to which external supply 86 is connected. The regulated supply output voltage on line 88 is fed to resistor network 76, the node 38 associated with output pad 12 and an input line to comparator 20 in FIG. 1. The circuit of FIG. 1 is not intended to be limited by any specific type of regulator nor any other specific circuit well known in the art.

What is claimed is:

1. A voltage regulation circuit, comprising:
    a voltage comparator having a first input coupled to receive a first voltage from an output pin of a circuit, a second input coupled to receive a reference voltage, and an output line configured to signal polarity of an error signal;
    a clocked state machine including a memory, the state machine configured to receive the error signal and to generate a voltage adjustment signal of corresponding polarity in response thereto;
    a voltage regulator configured to produce an incremental voltage step of either positive or negative polarity, a height of the step depending upon the polarity of a previous step, the polarity of the voltage step changing in response to a change in the polarity of the error signal, the voltage regulator having an output coupled to the first input; and
    a detector to detect a number of steps required to cross a reference voltage, the step number indicating a voltage level of the first input, wherein the incremental voltage step is repeatedly produced per clock cycle towards the reference voltage, and wherein the state machine stores a value corresponding to the number of steps required to cross the reference voltage and changes state to change the polarity of a next step when the output of the voltage regulator crosses the reference voltage.

2. The voltage regulation circuit of claim 1 wherein said state machine has means for signaling either states of positive and negative polarity.

3. The device of claim 1 wherein the trim bus is a switched resistor network, and the trim bus value is a three bit digital representation of a state of the switched resistor network.

4. A voltage regulation circuit for an output of a circuit, comprising:
    means for comparing a first voltage received by a first input from the output of the circuit with a second reference voltage and generating an output comparison signal having a first polarity if the first voltage exceeds the second voltage and a second polarity if the second voltage exceeds the first voltage;
    a logic means including a memory, the logic means for receiving the output comparison signal from the comparing means and for generating a correction signal level;
    a voltage regulator configured to receive the correction signal level from the logic means and output an incremental voltage step to the output of either positive or negative polarity, a height of the step being dependent upon the polarity of the previous step;
    a timing means for clocking the logic means and for repeatedly generating sequential correction levels with a sequence clock cycles; and
    a means for detecting a number of steps required to cross a reference voltage, the step number indicating a voltage level of the first input, wherein the incremental voltage step is produced per clock cycle towards the second reference voltage, and wherein the memory stores a value corresponding to the number of steps required to cross the reference voltage and wherein the logic means changes the polarity of a next step production of the incremental voltage step applied to the output of the voltage regulator is completed when the output of the voltage regulator crosses the second reference voltage.

5. The voltage regulation circuit of claim 4 wherein the logic means includes a register for retaining a correction level from a prior clock cycle.

6. The voltage regulation circuit of claim 4 wherein the comparing means, the logic means and the voltage regulator are arranged in a loop.

7. A method for regulating voltage at an output pin of a chip comprising:
sensing a first voltage at the output pin of the chip;
comparing the sensed first voltage from the output pin of the chip with a reference second voltage provided by a tester coupled to the chip;
generating a comparison signal having a first polarity if the first voltage exceeds the second voltage and a second polarity if the second voltage exceeds the first voltage;
clocking the generation of comparison signals with clock pulses of equal duration;
logically interpreting a state of the comparison signal with reference to a state of a prior comparison signal and generating an incremental correction level in response thereto wherein a number of steps to cross a reference voltage indicates a voltage level of the sensed first voltage;
generating a corrected output voltage to the output pin in response to the correction level, wherein the incremental correction level is produced per clock cycle towards the reference second voltage, and wherein the production of the incremental voltage step applied to the output voltage is completed when the output voltage crosses the reference second voltage; and
storing a trim value in a memory of the state machine representative of the output voltage crossing the reference second voltage.

8. The method of claim 6 further defined by applying the correction level to a switched resistor network.

9. The method of claim 8 further defined by generating the corrected output voltage using the switched resistor network.

10. A voltage regulation circuit, comprising:
a voltage comparator including a first input coupled to receive a first voltage from an output of the circuit whose output is to be regulated, a second input coupled to receive a reference voltage, and an output line to signal polarity of an error signal;
a clocked state machine including a memory, the state machine to receive the error signal and to generate a voltage adjustment signal of corresponding polarity in response to the error signal;
a voltage regulator to produce an incremental voltage step of either positive or negative polarity, the step including a height dependent on the polarity of a previous step, the polarity of the voltage step changing in response to a change in the polarity of the error signal, the voltage regulator having an output coupled to the first voltage; and
a detector to determine a number of steps required to cross a reference voltage, the step number indicating a voltage level of the first input, wherein the incremental voltage step is repeatedly produced per clock cycle towards the reference voltage, and wherein the state machine stores a value corresponding to the number of steps required to cross the reference voltage and changes state to change the polarity of a next step when the output of the voltage regulator crosses the reference voltage.

11. The voltage regulation circuit of claim 10, wherein said state machine is to signal states of positive and negative polarity.

12. The voltage regulation circuit of claim 10, comprising a timer to repeatedly generate sequential correction levels with a sequence clock cycles.

13. The voltage regulation circuit of claim 12, wherein the voltage regulator includes a register to retain a correction level from a prior clock cycle.

14. The voltage regulation circuit of claim 10, comprising a register to retain a correction level from a prior clock cycle.

15. The voltage regulation circuit of claim 10, wherein the first input of the voltage comparator is connected to an output pad.

16. The voltage regulation circuit of claim 10, wherein the state machine produces a trim bus signal based at least in part on registered prior logic output.

17. The voltage regulation circuit of claim 16, wherein the trim bus signal is clocked.

18. The voltage regulation circuit of claim 17, wherein the clocked trim bus signal is sent to a sense circuit and the voltage regulator.

19. The voltage regulation circuit of claim 10, wherein the voltage regulator includes a switchable resistor network that is switched to step the output voltage towards the reference voltage.

20. A device comprising:
a voltage regulator having an output and an input;
a comparator having an output, one input coupled to the output of the voltage regulator and another input to couple to a reference voltage;
a trim bus coupled to control the voltage regulator output;
a state machine having an input coupled to the output of the comparator and a digital output coupled to the trim bus to incrementally adjust the trim bus in a first direction responsive to the comparator output until the comparator output changes states, and to memorize a trim bus value upon the output of the comparator changing states indicative of the regulator voltage crossing the reference voltage.

21. The device of claim 20 wherein the trim bus value is incrementally adjusted to increase the regulator voltage when the regulator voltage is initially less than the reference voltage and to store the trim bus value when the regulator voltage becomes higher than the reference voltage.

22. The device of claim 20 wherein the trim bus value is incrementally adjusted to decrease the regulator voltage when the regulator voltage is initially greater than the reference voltage and to store the trim bus value when the regulator voltage becomes lower than the reference voltage.

* * * * *